(12) United States Patent
Chen et al.

(10) Patent No.: US 12,347,378 B2
(45) Date of Patent: *Jul. 1, 2025

(54) ELECTRONIC DEVICE

(71) Applicant: InnoLux Corporation, Miao-Li County (TW)

(72) Inventors: Lien-Hsiang Chen, Miao-Li County (TW); Kung-Chen Kuo, Miao-Li County (TW); Ming-Chun Tseng, Miao-Li County (TW); Cheng-Hsu Chou, Miao-Li County (TW); Kuan-Feng Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/530,589

(22) Filed: Dec. 6, 2023

(65) Prior Publication Data
US 2024/0105121 A1    Mar. 28, 2024

Related U.S. Application Data

(60) Continuation of application No. 17/884,701, filed on Aug. 10, 2022, now Pat. No. 11,887,537, which is a (Continued)

(30) Foreign Application Priority Data

May 17, 2016  (TW) ................................ 105115144

(51) Int. Cl.
*G09G 3/3233* (2016.01)
*H10D 86/40* (2025.01)
(Continued)

(52) U.S. Cl.
CPC ......... *G09G 3/3233* (2013.01); *H10D 86/421* (2025.01); *H10D 86/423* (2025.01);
(Continued)

(58) Field of Classification Search
CPC ............ H10K 59/1213; H01L 27/1222; H01L 27/1225; G09G 3/3233; G09G 2320/045;
(Continued)

(56) References Cited

U.S. PATENT DOCUMENTS 7,663,575 B2 *   2/2010  Choi .................... G09G 3/3233
                                                             315/169.3
8,330,492 B2 *  12/2012  Umezaki ................ H10D 86/01
                                                                326/87

(Continued)

*Primary Examiner* — Vinh T Lam
(74) *Attorney, Agent, or Firm* — BACON & THOMAS, PLLC

(57) ABSTRACT

An electronic device includes a substrate, a first silicon transistor, a second silicon transistor and a first oxide semiconductor transistor. The first silicon transistor, the second silicon transistor and the first oxide semiconductor transistor are disposed on the substrate. The first silicon transistor has a first terminal electrically connected to a first voltage level, a second terminal and a control terminal. The second silicon transistor has a first terminal electrically connected to the second terminal of the first silicon transistor, a second terminal electrically connected to a second voltage level, and a control terminal electrically connected to the control terminal of the first silicon transistor. The first oxide semiconductor transistor has a first terminal electrically connected to the first terminal of the second silicon transistor. Wherein, a voltage value of the first voltage level is greater than a voltage value of the second voltage level.

10 Claims, 20 Drawing Sheets

Related U.S. Application Data continuation of application No. 17/131,881, filed on Dec. 23, 2020, now Pat. No. 11,450,273, which is a continuation of application No. 16/411,620, filed on May 14, 2019, now Pat. No. 10,902,775, which is a division of application No. 15/364,350, filed on Nov. 30, 2016, now Pat. No. 10,332,446.

(60) Provisional application No. 62/387,213, filed on Dec. 24, 2015, provisional application No. 62/262,430, filed on Dec. 3, 2015.

(51) Int. Cl.
*H10D 86/60* (2025.01)
*H10K 59/121* (2023.01)

(52) U.S. Cl.
CPC ......... *H10D 86/60* (2025.01); *H10K 59/1213* (2023.02); *G09G 2300/0426* (2013.01); *G09G 2300/043* (2013.01); *G09G 2300/0809* (2013.01); *G09G 2300/0819* (2013.01); *G09G 2300/0842* (2013.01); *G09G 2300/0861* (2013.01); *G09G 2320/0233* (2013.01); *G09G 2320/045* (2013.01); *G09G 2330/021* (2013.01)

(58) Field of Classification Search
CPC ..... G09G 2310/061; G09G 2300/0842; G09G 2310/0251; G09G 2300/0809; G09G 2320/0247; G09G 2320/0233; G09G 2300/043; G09G 2330/12; G09G 2300/0417; G09G 2300/0426; G09G 2300/0819; G09G 2330/021; G09G 2300/0861

See application file for complete search history.

(56) References Cited

U.S. PATENT DOCUMENTS

| | | | | |
|---|---|---|---|---|
| 8,378,391 | B2* | 2/2013 | Koyama | H10F 39/8037 257/225 |
| 8,916,869 | B2* | 12/2014 | Koyama | H10F 39/8037 257/43 |
| 9,111,804 | B2* | 8/2015 | Yamazaki | H10D 86/60 |
| 9,117,713 | B2* | 8/2015 | Koyama | H10F 39/80377 |
| 9,331,112 | B2* | 5/2016 | Koyama | H10F 30/15 |
| 9,343,480 | B2* | 5/2016 | Yoneda | G11C 16/0433 |
| 9,349,757 | B2* | 5/2016 | Kimura | H10D 30/6756 |
| 9,406,705 | B2* | 8/2016 | Kwon | G09G 3/3233 |
| 9,489,882 | B2* | 11/2016 | Kim | G09G 3/2092 |
| 9,490,276 | B2* | 11/2016 | Kim | H10D 86/423 |
| 9,595,546 | B2* | 3/2017 | Kim | H10D 30/6755 |
| 9,715,845 | B2* | 7/2017 | Umezaki | H10D 86/60 |
| 9,842,735 | B2* | 12/2017 | Niu | H10D 30/6745 |
| 9,887,292 | B2* | 2/2018 | Liu | H10D 86/60 |
| 9,905,596 | B2* | 2/2018 | Koyama | H04N 25/778 |
| 9,935,127 | B2* | 4/2018 | Zhao | H10D 30/6704 |
| 10,074,576 | B2* | 9/2018 | Kato | H10D 86/423 |
| 10,186,528 | B2* | 1/2019 | Lee | H10D 30/6731 |
| 10,211,344 | B2* | 2/2019 | Yamazaki | H10D 86/423 |
| 10,325,937 | B2* | 6/2019 | Lee | H10D 30/6745 |
| 10,339,859 | B2* | 7/2019 | Nie | G09G 3/3233 |
| 10,373,843 | B2* | 8/2019 | Yamazaki | H10D 30/6757 |
| 10,490,671 | B2* | 11/2019 | Yamazaki | H10D 86/60 |
| 2022/0383818 | A1 | 12/2022 | Chen et al. | |

* cited by examiner

| Leakage Current of Transistor (Ioff) | | Circuit | | | Impact priority |
|---|---|---|---|---|---|
| | | FIG. 3 | FIG. 5 | FIG. 7 | |
| RST (T4) | Contact Gate | O | X | O | 1 |
| | ΔI/frame | +0.2u | -0.0028u | +0.084u | |
| Comp. (T3) | Contact Gate | O | O | O | 2 |
| | ΔI/frame | -0.04u | -0.06u | +0.054u | |
| REFN (T6) | Contact Gate | - | X | X | 3 |
| | ΔI/frame | - | -0.0058u | +0.0003u | |
| Data (T5) | Contact Gate | X | X | X | 4 |
| | ΔI/frame | -0.0017u | -0.005u | +0.0003u | |

FIG. 10

ELECTRONIC DEVICE

BACKGROUND

1. Field of the Disclosure

The present disclosure relates to the technical field of display panels and, more particularly, to a driving circuit of active-matrix organic light-emitting diode with hybrid transistors.

2. Description of Related Art

According to manufacture process of the substrate, the driving transistor type of active matrix organic light-emitting diode (AMOLED) pixel can be divided into the P-type and N-type. FIG. 1 is a schematic diagram of a conventional pixel driving circuit. The conventional pixel driving circuit is a 2T1C (two transistors one capacitor) P-type driving circuit. The conventional pixel driving circuit is used to drive a normal organic light-emitting diode (OLED). Most P-type driving circuits use the low temperature poly-silicon (LTPS) technology to fabricate the transistors of the P-type driving circuits.

The P-type driving transistor PTFT_dri has a gate/source voltage (Vgs) that corresponds to a data level and a high level ELVDD, wherein the high level ELVDD has a constant relative high voltage value. For the known P-type driving transistor PTFT_dri, it encounters the phenomenon of threshold voltage deviation. That is, due to the polycrystalline process, the threshold voltages Vt of different LTPS P-type driving transistors are varied owing to different locations of the LTPS P-type driving transistors. Accordingly, when driving voltages of the same value are inputted to two P-type driving transistors of the same size, they cannot output currents of the same value, resulting in a brightness uniformity (mura) or poor brightness problem. Therefore, it is required to compensate the threshold voltage Vt of the P-type driving transistor.

In performing the voltage compensation, there are a plurality of transistors required for the driving circuit, which results in increased current consumption. In high-resolution applications, for example FHD_1080RGBx1920, or QHD_1440RGBx2560, the number of the driving circuits is dramatically increased and thus the current consumption is also increased, so that the usage time of a hand-held device is decreased. Therefore, it is desired for the prior driving circuit to be improved for mitigating and/or obviating the aforementioned problems.

SUMMARY

The object of the present disclosure is to provide a driving circuit of active-matrix organic light-emitting diode with hybrid transistors, in which the transistor in a current drive unit of the driving circuit is a low temperature poly-silicon (LTPS) transistor. The LTPS transistor can provide large current in its turn-on state with a large driving capability for driving an organic light-emitting diode (OLED). At the same time, partial transistors in a reset compensation and light emitting control circuit of the driving circuit are replaced by oxide semiconductor transistors for providing a low leakage current to reduce the variation of the threshold voltage of the transistor in the current drive unit. Therefore, the transistor in the current drive unit can provide a stable driving current to the OLED to overcome the mura or poor brightness uniformity problem.

Another object of the present disclosure is to provide a transistor sharing architecture between two driving circuit for dramatically reducing the number of transistors.

According to a first aspect of the disclosure, there is provided a driving circuit, which comprises a current drive unit, and a reset compensation and light emitting control circuit. The current drive unit includes a first transistor and a second transistor. The first transistor and the second transistor are connected in series, wherein the first transistor and the second transistor comprise a silicon semiconductor layer. The reset compensation and light emitting control circuit is coupled to the current drive unit. The reset compensation and light emitting control circuit comprises a third transistor connected to a control terminal of the first transistor, wherein the third transistor comprises an oxide semiconductor transistor.

According to a second aspect of the disclosure, there is provided a display device. The display device comprises a substrate, a display media, a current drive unit, and a reset compensation and light emitting control circuit. The display media is disposed above the substrate. The current drive unit is disposed above the substrate. The current drive unit includes a first transistor and a second transistor. The first transistor and the second transistor are connected in series, wherein the first transistor and the second transistor comprise a silicon semiconductor layer, respectively. The reset compensation and light emitting control circuit is coupled to the current drive unit. The reset compensation and light emitting control circuit comprises a third transistor connected to a control terminal of the first transistor, wherein the third transistor comprises an oxide semiconductor transistor.

Other objects, advantages, and novel features of the disclosure will become more apparent from the following detailed description when taken in conjunction with the accompanying drawings.

BRIEF DESCRIPTION OF THE DRAWINGS

FIG. 10 schematically illustrates simulation results for the circuits of FIG. 3, FIG. 5 and FIG. 7 according to the present disclosure;

DETAILED DESCRIPTION

Figure 1:
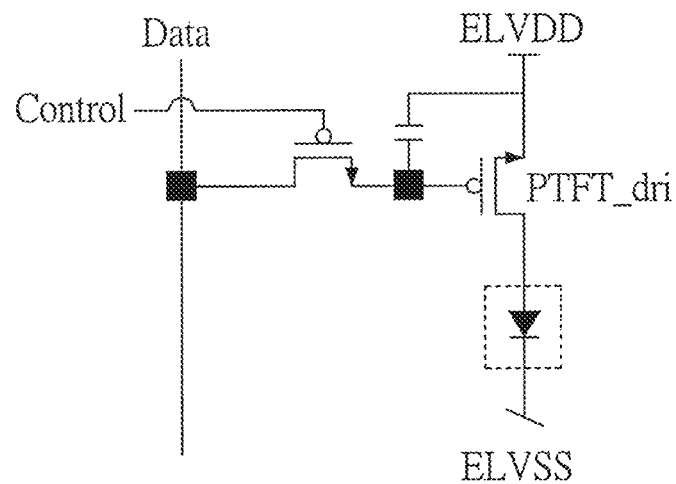
FIG. 1 is a schematic diagram of a prior pixel driving circuit.
Figure 2:
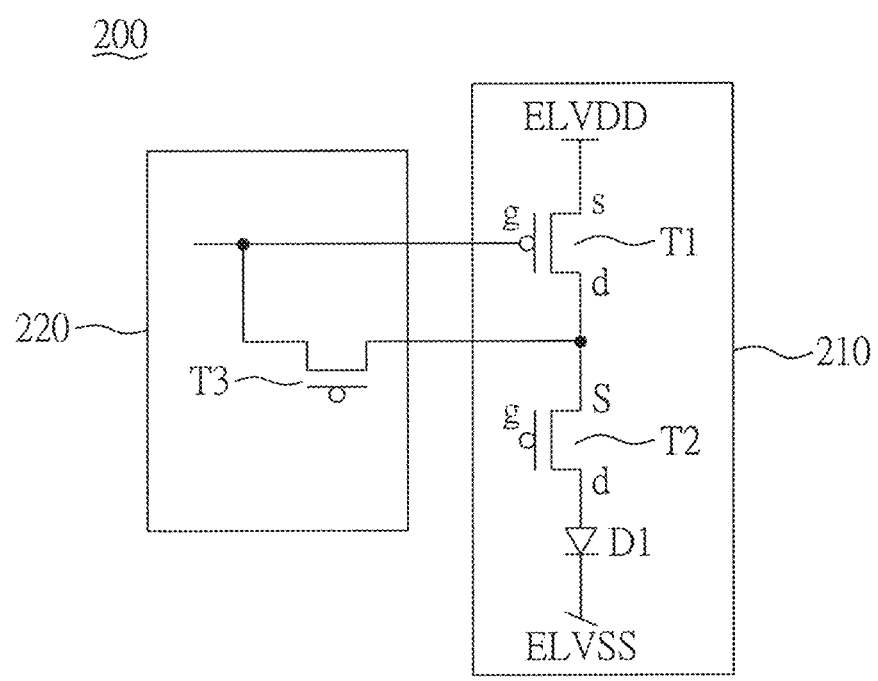
FIG. 2 is a block diagram of a driving circuit of active-matrix organic light-emitting diode with hybrid transistors according to the present disclosure.

FIG. 2 is a block diagram of a driving circuit 200 of active-matrix organic light-emitting diode with hybrid transistors according to the present disclosure. As shown in FIG. 2, the driving circuit 200 includes a current drive unit 210 and a reset compensation and light emitting control circuit 220. The driving circuit 200 is provided to drive an active-matrix organic light-emitting diode (AM-OLED) D1. The current drive unit 210 includes a first transistor (T1) and a second transistor (T2) which are connected in series, wherein the first transistor (T1) and the second transistor (T2) comprises a silicon semiconductor layer, respectively. The silicon semiconductor layer is a low temperature poly-silicon (LTPS) layer. That is, the first transistor (T1) and the second transistor (T2) are LTPS transistors. The reset compensation and light emitting control circuit 220 is coupled to the current drive unit 210. The reset compensation and light emitting control circuit 220 includes a third transistor (T3) connected to a control terminal (g) of the first transistor (T1), wherein the third transistor (T3) comprise an oxide semiconductor layer. The oxide semiconductor layer is an Indium Gallium Zinc Oxide (IGZO) layer. The third transistor (T3) is an oxide semiconductor transistor. The oxide semiconductor transistor can be an Indium Gallium Zinc Oxide (IGZO) transistor.

Figure 3:
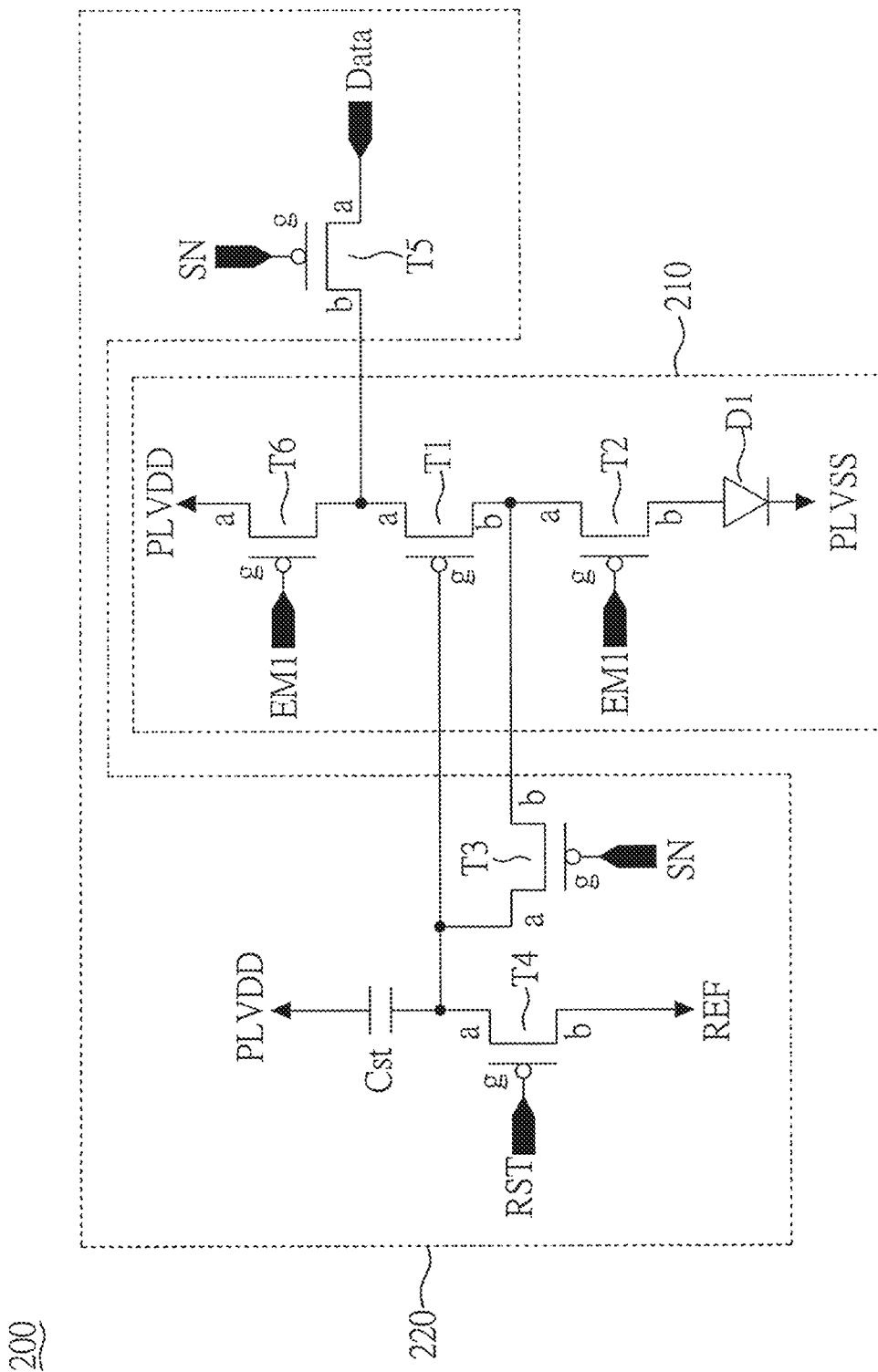
FIG. 3 is a circuit diagram of a driving circuit of active-matrix organic light-emitting diode with hybrid transistors according to an embodiment of the present disclosure.

FIG. 3 is a circuit diagram of a driving circuit 200 of active-matrix organic light-emitting diode with hybrid transistors according to an embodiment of the present disclosure. As shown in FIG. 3, the reset compensation and light emitting control circuit 220 includes a first capacitor (Cst), a third transistor (T3), a fourth transistor (T4), and a fifth transistor (T5). The current drive unit 210 includes a first transistor (T1), a second transistor (T2), and a sixth transistor (T6). The first capacitor (Cst) has one terminal connected to a high level (PLVDD). The other terminal of the first capacitor (Cst) is connected to a control terminal (g) of the first transistor (T1), a first terminal (a) of the third transistor (T3) and a first terminal (a) of the fourth transistor (T4).

The fourth transistor (T4) has a control terminal (g) connected to a reset signal (RST). A second terminal (b) of the fourth transistor (T4) is connected to a reference signal (REF). In the present disclosure, the first terminal (a) and the second terminal (b) can be a drain and a source of a transistor, respectively, or can be a source and a drain of a transistor, respectively. If the transistor is used as a MOS switch, the first terminal (a) and the second terminal (b) are exchangeable.

The third transistor (T3) has a second terminal (b) connected to a second terminal (b) of the first transistor (T1) and a first terminal (a) of the second transistor (t2). A control terminal (g) of the third transistor (T3) is coupled to a first control signal (SN). The second transistor (T2) has a second terminal (b) connected to one terminal of the OLED (D1). A control terminal (g) of the second transistor (T2) is connected to a second control signal (EM1). The fifth transistor (T5) has a first terminal (a) connected to a data line (Data). A second terminal (b) of the fifth transistor (T5) is connected to a first terminal (a) of the first transistor (T1) and a second terminal (b) of the sixth transistor (T6). The sixth transistor (T6) has a first terminal (a) connected to the high level (PLVDD). A control terminal (g) of sixth transistor (T6) is connected to the second control signal (EM1). The other terminal of the OLED (D1) is connected to a low level (PLVSS), wherein the fourth transistor (T4) is an oxide semiconductor transistor, and the second transistor (T2) and the sixth transistor (T6) are low-temperature poly-silicon (LTPS) transistors. The fifth transistor (T5) can be an oxide semiconductor transistor or a low-temperature poly-silicon (LTPS) transistor.

Figure 4:
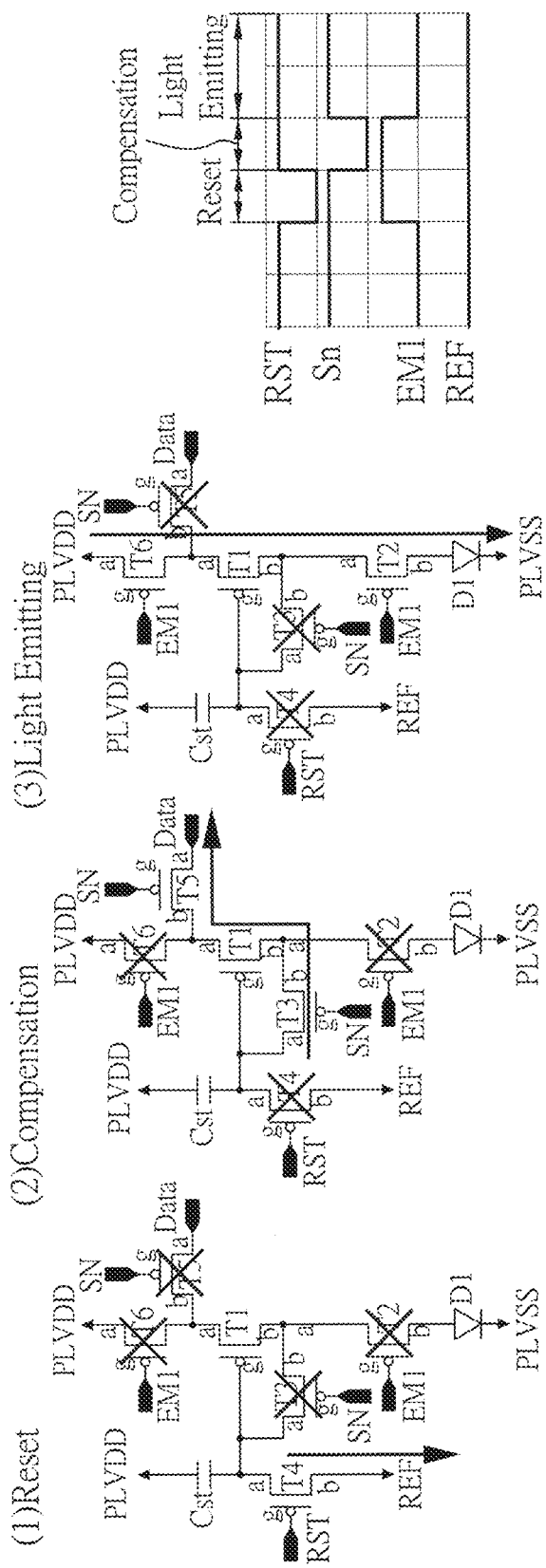
FIG. 4 is a schematic diagram illustrating the operation of the driving circuit of FIG. 3 according to the present disclosure.

FIG. 4 is a schematic diagram illustrating the operation of the driving circuit 200 of FIG. 3 according to the present disclosure. In FIG. 4, it shows a timing diagram of the driving circuit 200, the states of each transistor of the driving circuit 200, and the node voltage of the first transistor (T1).

As shown in FIG. 4, in a reset period (Trst), the reset signal (RST) is a low control level (VSS), the second control signal (SN) is a high control level (VDD), and the first control signal (EM1) is a high control level (VDD). The voltage level of the high control level (VDD) can be equal to or different from that of the high level (PLVDD). Similarly, the voltage level of the low control level (VSS) can be equal to or different from that of the low level (PLVSS).

In the reset period (Trst), the second transistor (T2), the third transistor (T3), the fifth transistor (T5), and the sixth transistor (T6) are turned off and the first transistor (T1) and the fourth transistor (T4) are turned on. Thus, the voltage of the control terminal (g) of the first transistor (T1) is reset to Vref, wherein Vref is the voltage of the reference signal (REF). Owing to the sixth transistor (T6) being turned off, the first terminal (a) of the first transistor (T1) is in a floating statel.

In a compensating period (Tcomp), the reset signal (RST) is a high control level (VDD), the second control signal (SN) is a low control level (VSS), and the first control signal (EM1) is a high control level (VDD). The second transistor (T2), the fourth transistor (T4), and the sixth transistor (T6) are turned off and the first transistor (T1), the third transistor (T3), and the fifth transistor (T5) are turned on. The signal of the data line (Data) is transmitted to the control terminal (g) of the first transistor (T1) through the fifth transistor (T5), the first transistor (T1), and the third transistor (T3). Thus, the voltage of the control terminal (g) of the first transistor (T1) is equal to Vdata+|Vtp| and the voltage of the first terminal (a) of the first transistor (T1) is equal to Vdata, wherein Vdata is the voltage of the signal of the data line (Data) and Vtp is the threshold voltage of the first transistor (T1).

In a light emitting period (Temit), the reset signal (RST) is a high control level (VDD), the second control signal (SN) is a high control level (VDD), and the first control signal (EM1) is a low control level (VSS). The third transistor (T3), the fourth transistor (T4), and the fifth transistor (T5) are turned off and the first transistor (T1), the second transistor (T2), and the sixth transistor (T6) are turned on. The current of the high level (PLVDD) flows into the OLDE (D1) through the sixth transistor (T6), the first transistor (T1), and the second transistor (T2). Owing to the third transistor (T3) and the fourth transistor (T4) being turned off, the voltage of the control terminal (g) of the first transistor (T1) is equal to Vdata+|Vtp|. Owing to the sixth transistor (T6) being turned on, the voltage of the first terminal (a) of the first transistor (T1) is equal to the high level (PLVDD).

Figure 5:
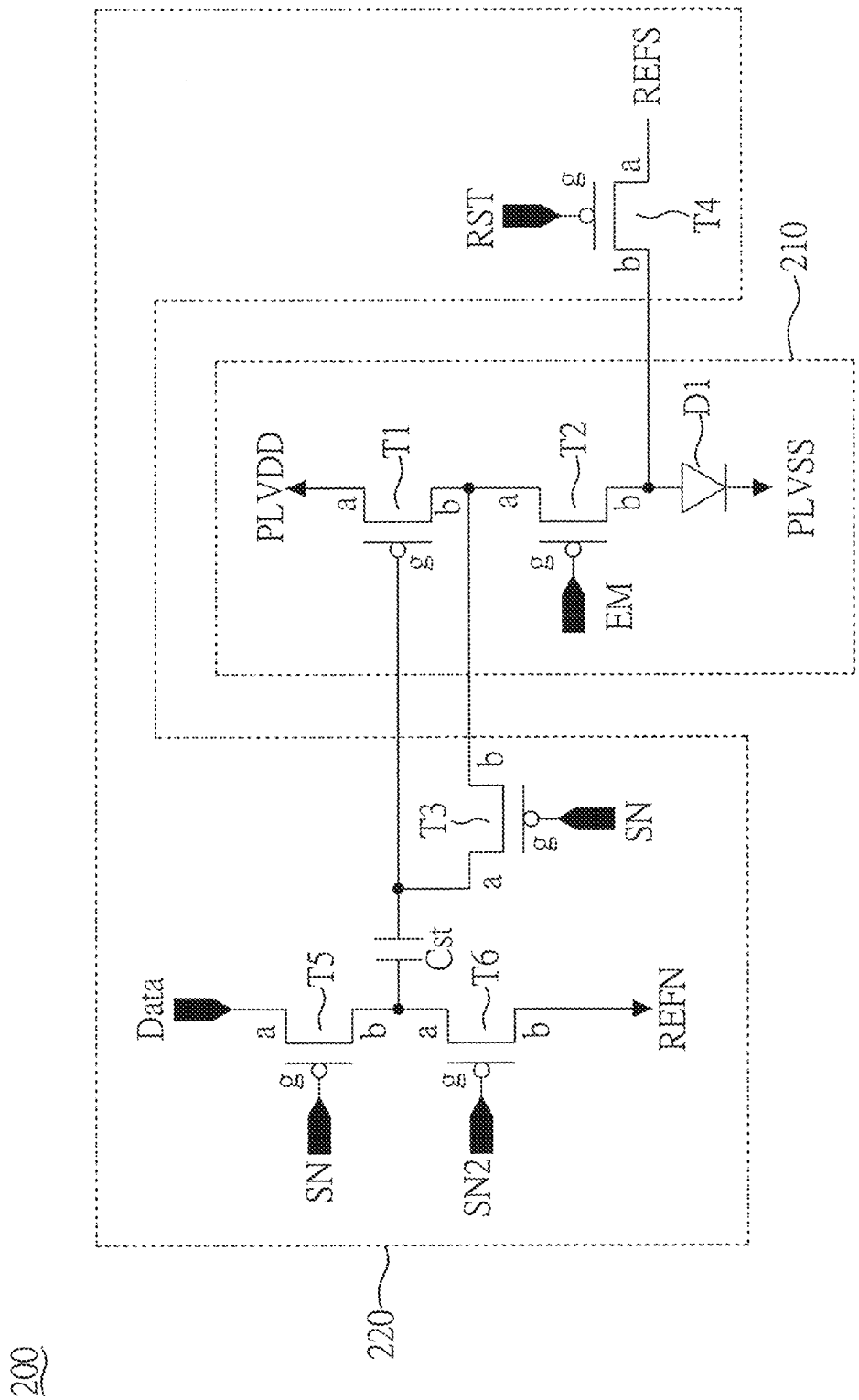
FIG. 5 is a circuit diagram of a driving circuit of active-matrix organic light-emitting diode with hybrid transistors according to another embodiment of the present disclosure.

FIG. 5 is a circuit diagram of a driving circuit 200 of active-matrix organic light-emitting diode with hybrid transistors according to another embodiment of the present disclosure. As shown in FIG. 5, the reset compensation and light emitting control circuit 220 includes a first capacitor (Cst), a third transistor (T3), a fourth transistor (T4), a fifth transistor (T5) and a sixth transistor (T6). The current drive unit 210 includes a first transistor (T1), and a second transistor (T2). The first transistor (T1) has a first terminal (a) connected to the high level (PLVDD). A second terminal (b) of the first transistor (T1) is connected to a first terminal (a) of the second transistor (T2) and a second terminal (b) of the third transistor (T3).

The second transistor (T2) has a second terminal (b) connected to an OLED (D1) and a second terminal (b) of the four transistor (T4). A control terminal (g) of the second transistor (T2) is connected to a first control signal (EM). The other terminal of the OLED is connected to a low level (PLVSS). The third transistor (T3) has a first terminal (a) connected to a control terminal (g) of the first transistor (T1) and one terminal of the first capacitor (Cst). A control terminal (g) of the third transistor (T3) is connected to a second control signal (SN).

The other terminal of the first capacitor (Cst) is connected to a second terminal (b) of the fifth transistor (T5) and a first terminal (a) of the sixth transistor (T6). The fifth transistor (T5) has a first terminal (a) connected to a data line (Data). A control terminal (g) of the fifth transistor (T5) is connected to the second control signal (SN). The sixth transistor (T6) has a second terminal (b) connected to a first reference signal (REFN). A control terminal (g) of the sixth transistor (T6) is connected to a third control signal (SN2). The fourth transistor (T4) has a first terminal (a) connected to a second reference signal (REFS). A control terminal (g) of the fourth transistor (T4) is connected to a reset signal (RST). The second transistor (T2) is a low-temperature poly-silicon (LTPS) transistor, and the fourth transistor (T4), the fifth transistor (T5), and the sixth transistor (T6) can be LTPS transistors or oxide semiconductor transistors.

Figure 6:
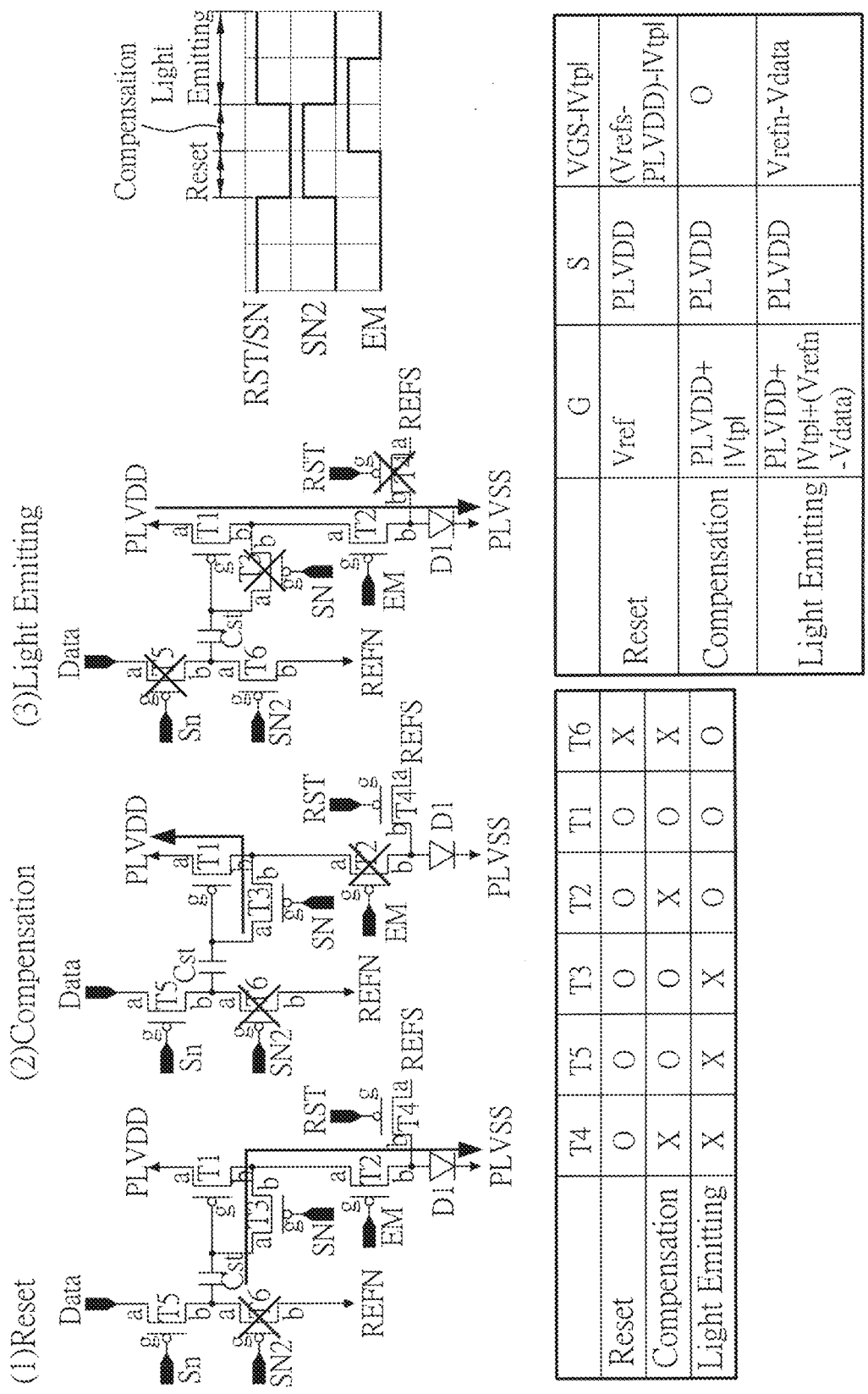
FIG. 6 is a schematic diagram illustrating the operation of the driving circuit of FIG. 5 according to the present disclosure.

FIG. 6 is a schematic diagram illustrating the operation of the driving circuit 200 of FIG. 5 according to the present disclosure. In FIG. 6, it shows a timing diagram of the driving circuit 200, the states of each transistor of the driving circuit 200, and the node voltage of the first transistor (T1). The operations of the reset period (Trst), the compensating period (Tcomp), and the light emitting period (Temit) are well-known to the person skilled in the art based on the descriptions of FIG. 4 of the present disclosure, and thus a detailed description therefor is deemed unnecessary. In FIG. 6, Vrefn represents the voltage of the first reference signal (REFN), Vrefs represents the voltage of the second reference signal (REFS), and Vdata represents the voltage of the data line (Data).

Figure 7:
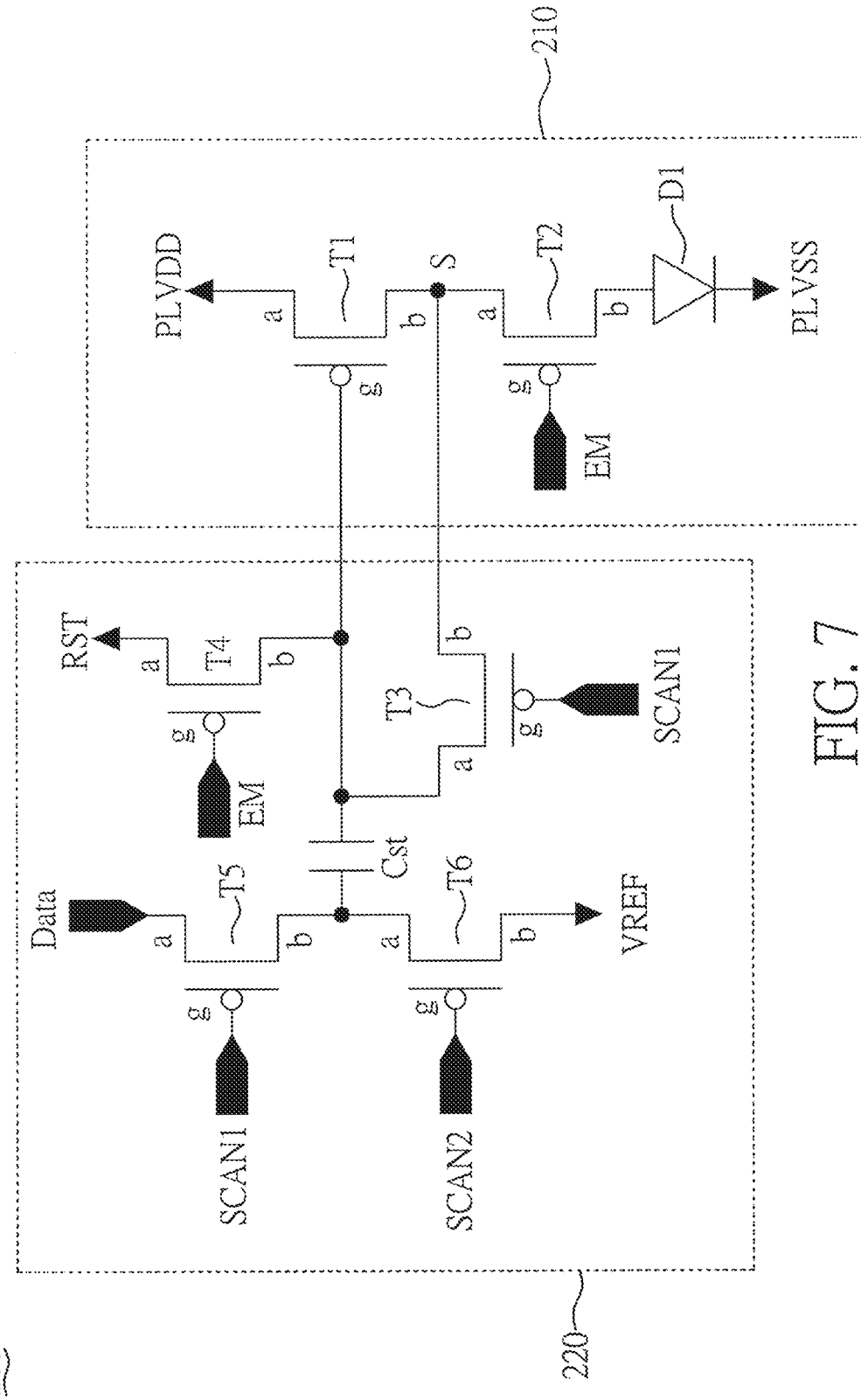
FIG. 7 is a circuit diagram of a driving circuit of active-matrix organic light-emitting diode with hybrid transistors according to still another embodiment of the present disclosure.

FIG. 7 is a circuit diagram of a driving circuit 200 of active-matrix organic light-emitting diode with hybrid transistors according to still another embodiment of the present disclosure. As shown in FIG. 7, the reset compensation and light emitting control circuit 220 includes a first capacitor (Cst), a third transistor (T3), a fourth transistor (T4), a fifth transistor (T5) and a sixth transistor (T6). The current drive unit 210 includes a first transistor (T1), and a second transistor (T2). The first transistor (T1) has a first terminal (a) connected to the high level (PLVDD). A second terminal (b) of the first transistor (T1) is connected to a first terminal (a) of the second transistor (T2) and a second terminal (b) of the third transistor (T3).

The second transistor (T2) has a second terminal (b) connected to an OLED (D1). A control terminal (g) of second transistor (T2) connected to a first control signal (EM). The third transistor (T3) has a first terminal (a) connected to a control terminal (g) of the first transistor (T1), one terminal of the first capacitor (Cst) and a second terminal (b) of the fourth transistor (T4). A control terminal (g) of the third transistor (T3) is connected to a second control signal (SCAN1). The fourth transistor (T4) has a first terminal (a) connected to a reset signal (RST). A control terminal (g) of the fourth transistor (T4) is connected to a third control signal (EM). The other terminal of the first capacitor (Cst) is connected to a second terminal (b) of the fifth transistor (T5) and a first terminal (a) of the sixth transistor (t6). The fifth transistor (T5) has a first terminal (a) connected to a data line (Data). A control terminal (g) of the fifth transistor (T5) is connected to the second control signal (SCAN1). The sixth transistor (T6) has a second terminal (b) connected to a first reference signal (VREF). A control terminal (g) of the sixth transistor (T6) is connected to a fourth control signal (SCAN2). The fourth transistor (T4) is an oxide semiconductor transistor and the second transistor (T2) is a low-temperature poly-silicon (LTPS) transistor. The fifth transistor (T5) and the sixth transistor (T6) can be LTPS transistors or oxide semiconductor transistors.

Figure 8:
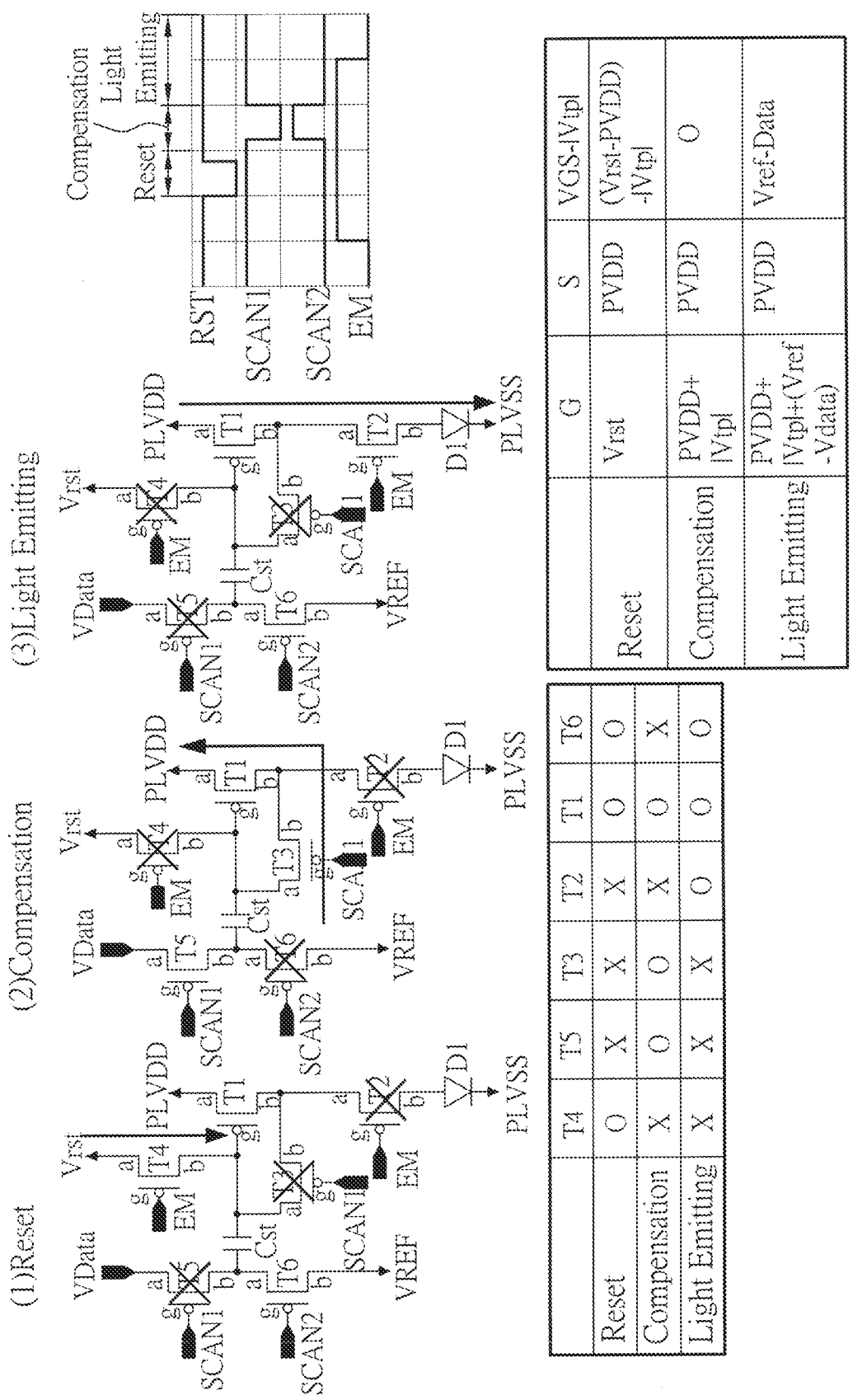
FIG. 8 is a schematic diagram illustrating the operation of the driving circuit of FIG. 7 according to the present disclosure.

FIG. 8 is a schematic diagram illustrating the operation of the driving circuit 200 of FIG. 7 according to the present disclosure. In FIG. 8, it shows a timing diagram of the driving circuit 200, the states of each transistor of the driving circuit 200, and the node voltage of the first transistor (T1). The operations of the reset period (Trst), the compensating period (Tcomp), and the light emitting period (Temit) are well-known to the person skilled in the art based on the descriptions of FIG. 4 of the present disclosure, and thus a detailed description therefor is deemed unnecessary. In FIG. 8, Vref represents the voltage of the first reference signal (REF), Vrst represents the voltage of the reset signal (RST), and Vdata represents the voltage of the data line (Data).

Figure 9:
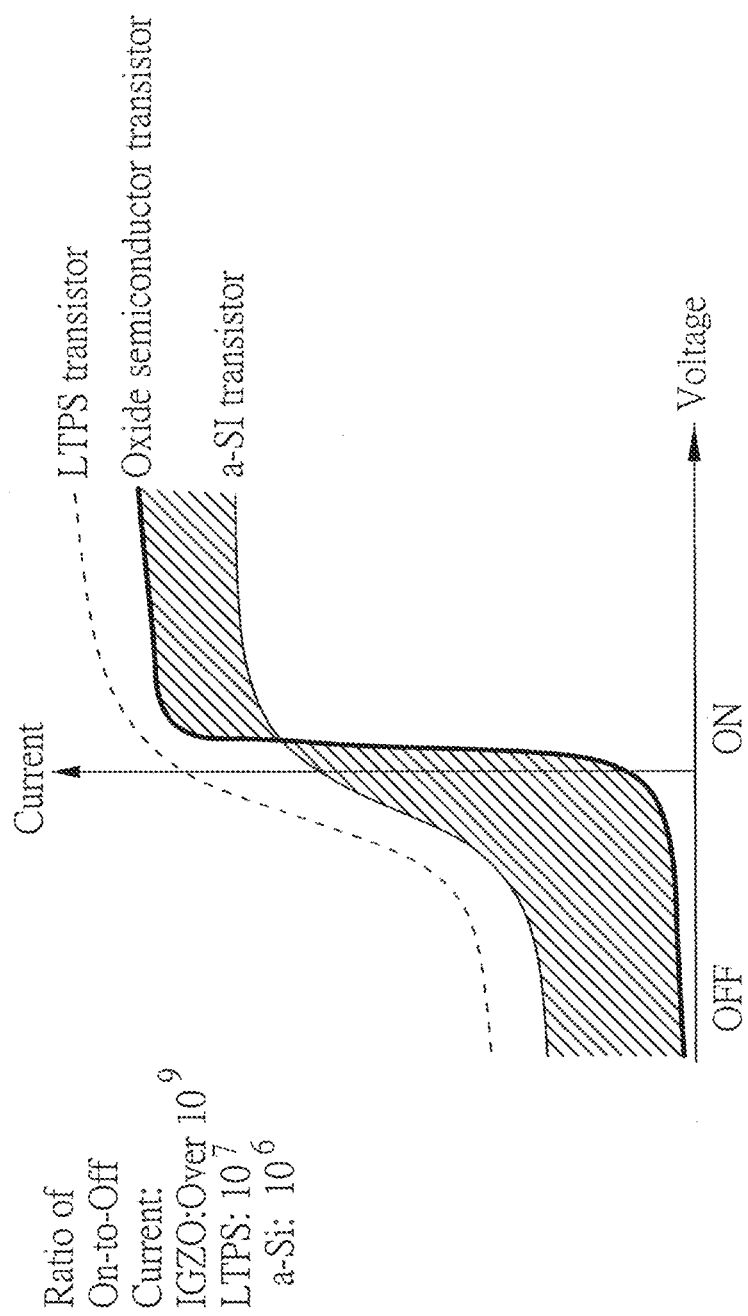
FIG. 9 schematically illustrates currents of the LTPS transistor, the oxide semiconductor transistor, and the amorphous silicon (a-Si) transistor.

FIG. 9 schematically illustrates currents of the LTPS transistor, the oxide semiconductor transistor, and the amorphous silicon (a-Si) transistor. As shown in FIG. 9, the LTPS transistor has a large current in ON state. The oxide semiconductor transistor has a low leakage current in the OFF state. The leakage current of the oxide semiconductor transistor is much smaller than those of the LTPS transistor and the a-Si transistor.

FIG. 10 schematically illustrates simulation results for the circuits of FIG. 3, FIG. 5 and FIG. 7 according to the present disclosure. FIG. 10 shows the influence of leakage current (Ioff) on the operation of the transistor being turned off. The simulation parameters are described as follows: PLVDD is 7 voltages, PLVSS is −1 voltage, the value of capacitor (Cst) is 0.1 pF, and Vdata is 4 voltages. As shown in FIG. 10, in the row of Contact Gate, "0" represents that the transistor is connected to the control terminal (g) of the first transistor (T1), and "X" represents that the transistor is not connected to the control terminal (g) of the first transistor (T1). For example, for the fourth transistor (T4), the row of Contact Gate being "OXO" represents that the fourth transistor (T4) of FIG. 3 is connected to the control terminal (g) of the first transistor (T1), the fourth transistor (T4) of FIG. 5 is not connected to the control terminal (g) of the first transistor (T1), and the fourth transistor (T4) of FIG. 7 is connected to the control terminal (g) of the first transistor (T1), respectively. As shown in FIG. 10, the value of ΔI/frame represents the current difference of the OLED (D1) in rendering each display frame. The current difference ΔI/frame is produced from the leakage current of the transistors of the circuit. In the intersection fields of the row of the fourth transistor (T4) and the columns of FIG. 3, FIG. 5, and FIG. 7, the values of ΔI/frame are +0.2 u, −0.0028 u, and +0.84 u, respectively, indicating that the fourth transistor (T4) of FIG. 3 influences the current of OLED (D1) with +0.2 uA (micro-ampere), the fourth transistor (T4) of FIG. 5 influences the current of OLED (D1) with −0.0028 uA (micro-ampere), and the fourth transistor (T4) of FIG. 7 influences the current of OLED (D1) with +0.84 uA (micro-ampere), respectively.

As shown in FIG. 10, if a transistor is connected to the control end (g) of the first transistor (T1), it may need a low leakage current to eliminate the voltage variation of the control terminal (g) of the first transistor (T1) so as to further eliminate the current variation of the OLED (D1). Therefore, in the present disclosure, each of the transistors of the current drive unit 210 is an LTPS transistor to provide a large driving current to drive the OLDE (D1). The transistor of the reset compensation and light emitting control circuit 220 which is connected to the control terminal (g) of the first transistor (T1) is an oxide semiconductor transistor for providing a low leakage current to eliminate the voltage variation of the control terminal (g) of the first transistor (T1) and the current variation of the OLED (D1). Thus, the present disclosure can mitigate the mura or poor brightness uniformity problem.

Figure 11:
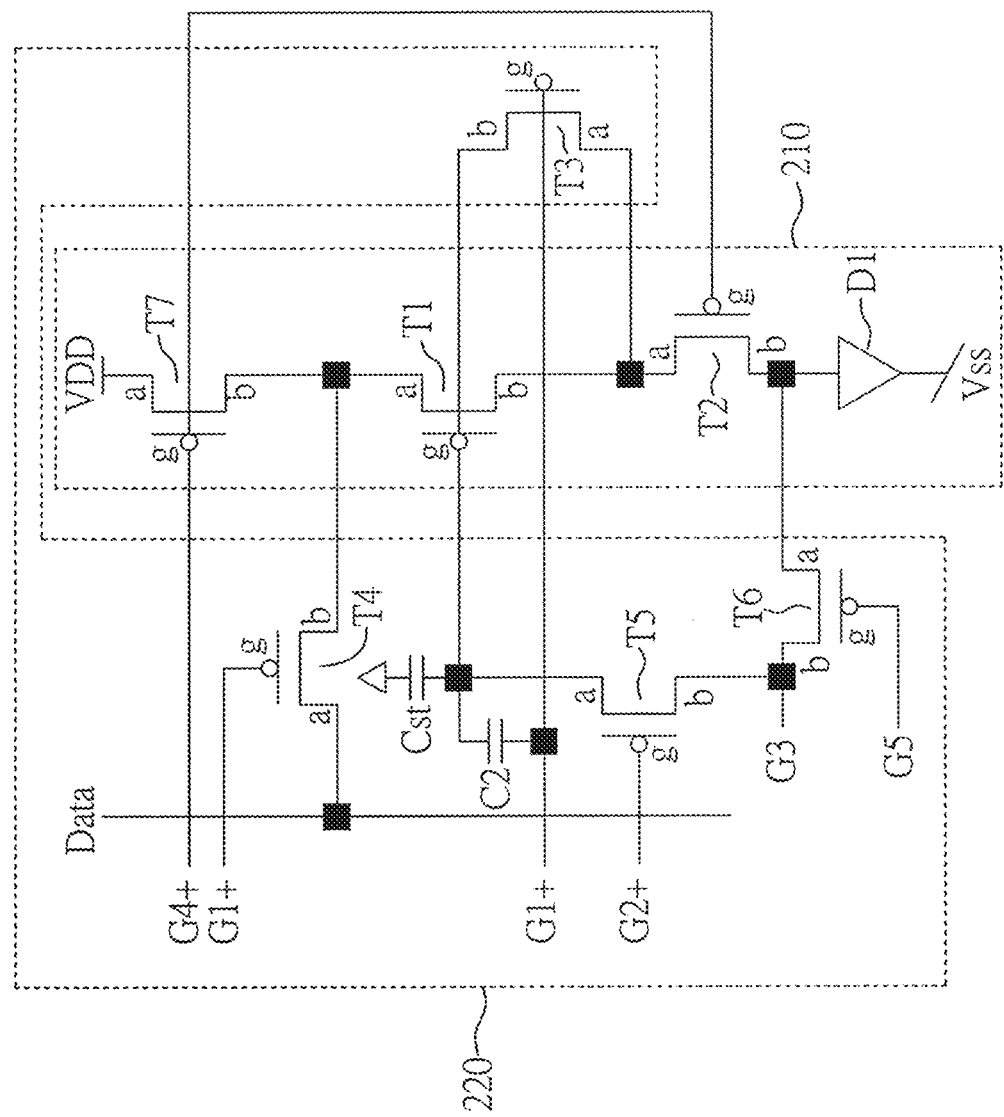
FIG. 11 is a circuit diagram of a driving circuit of active-matrix organic light-emitting diode with hybrid transistors according to yet another embodiment of the present disclosure.

FIG. 11 is a circuit diagram of a driving circuit 200 of active-matrix organic light-emitting diode with hybrid transistors according to yet another embodiment of the present disclosure. As shown in FIG. 11, the reset compensation and light emitting control circuit 220 includes a first capacitor (Cst), a second capacitor (C2), a third transistor (T3), a fourth transistor (T4), a fifth transistor (T5) and a sixth transistor (T6). The current drive unit 210 includes a first transistor (T1), a second transistor (T2), and a seventh transistor (T7). The first transistor (T1) has a first terminal (a) connected to a second terminal (b) of the fourth transistor (T4) and a second terminal (b) of the seventh transistor (T7). A second terminal (b) of the first transistor (T1) is connected to a first terminal (a) of the second transistor (T2) and a first terminal (a) of the third transistor (T3).

The second transistor (T2) has a second terminal (b) connected to one end of an OLED (D1) and a first terminal (a) of the sixth transistor (T6). A control terminal (g) of the second transistor (T2) is connected to a first control signal (G4+). The third transistor (T3) has a second terminal (b) connected to a control terminal (g) of the first transistor (T1), one terminal of the first capacitor (Cst), one terminal of the second capacitor (C2) and a first terminal (a) of the fifth transistor (T5). A control terminal (g) of the third transistor (T3) is connected to a second control signal (G1+) and the other terminal of the second capacitor (C2). The other terminal of the first capacitor (Cst) is connected to a low level.

The fourth transistor (T4) has a first terminal (a) connected to a data line (Data). A control terminal (g) of the fourth transistor (T4) is connected to the second control signal (G1+). The fifth transistor (T5) has a second terminal (b) connected to a third control signal (G3) and a second terminal (b) of the sixth transistor (T6). A control terminal (g) of the fifth transistor (T5) is connected to a four control signal (G2+). The sixth transistor (T6) has a control terminal (g) connected to a fifth control signal (G5). The seventh transistor (T7) has a first terminal (a) connected to the high level (VDD). A control terminal (g) of the seventh transistor (T7) is connected to the first control signal (G4+). The fifth transistor (T5) is an oxide semiconductor transistor and the seventh transistor (T7) is a low temperature poly-silicon (LTPS) transistor. The fourth transistor (T4) and the sixth transistor (T6) can be oxide semiconductor transistors or LTPS transistors.

Figure 12:
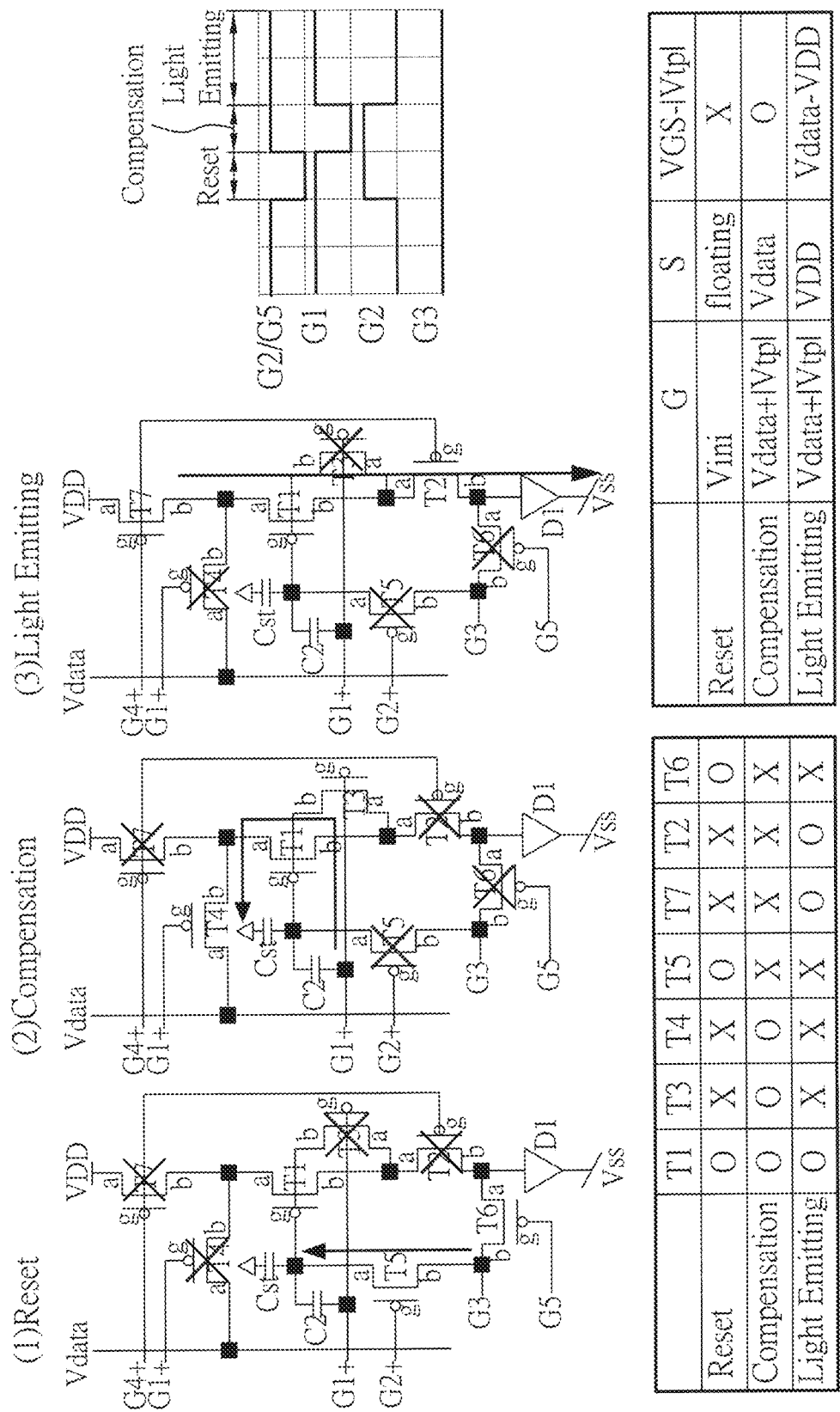
FIG. 12 is a schematic diagram illustrating the operation of the driving circuit of FIG. 11 according to the present disclosure.

FIG. 12 is a schematic diagram illustrating the operation of the driving circuit 200 of FIG. 11 according to the present disclosure. In FIG. 12, it shows a timing diagram of the driving circuit 200, the states of each transistor of the driving circuit 200, and the node voltage of the first transistor (T1). The operations of the reset period (Trst), the compensating period (Tcomp), and the light emitting period (Temit) are well-known to the person skilled in the art based on the descriptions of FIG. 4 of the present disclosure, and thus a detailed description therefor is deemed unnecessary. In FIG. 12, Vdata represents the voltage of the data line (Data).

Figure 13:
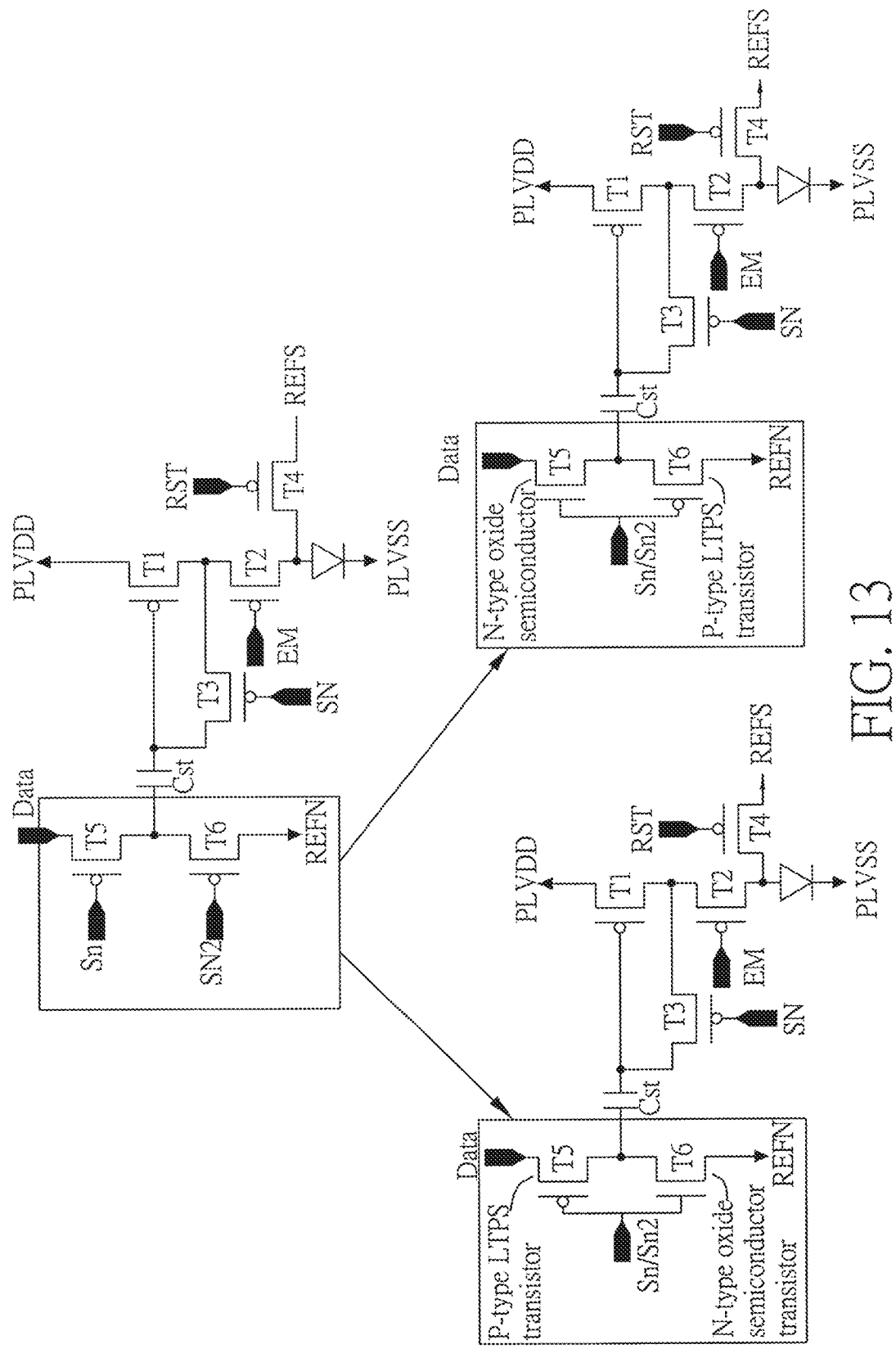
FIG. 13 is a circuit diagram of two driving circuits modified from the driving circuit of FIG. 5 according to the present disclosure.

FIG. 13 is a schematic diagram illustrating two driving circuits modified from the driving circuit 200 of FIG. 5 according to the present disclosure. As shown in FIG. 13, the second control signal (SN) is shorted with third control signal (SN2). In the left-bottom corner of FIG. 13, the fifth transistor (T5) is a P-type LTPS transistor and the sixth transistor (T6) is an N-type oxide semiconductor transistor. In the right-bottom corner of FIG. 13, the fifth transistor (T5) is an N-type oxide semiconductor transistor and the sixth transistor (T6) is a P-type LTPS transistor.

Figure 14:
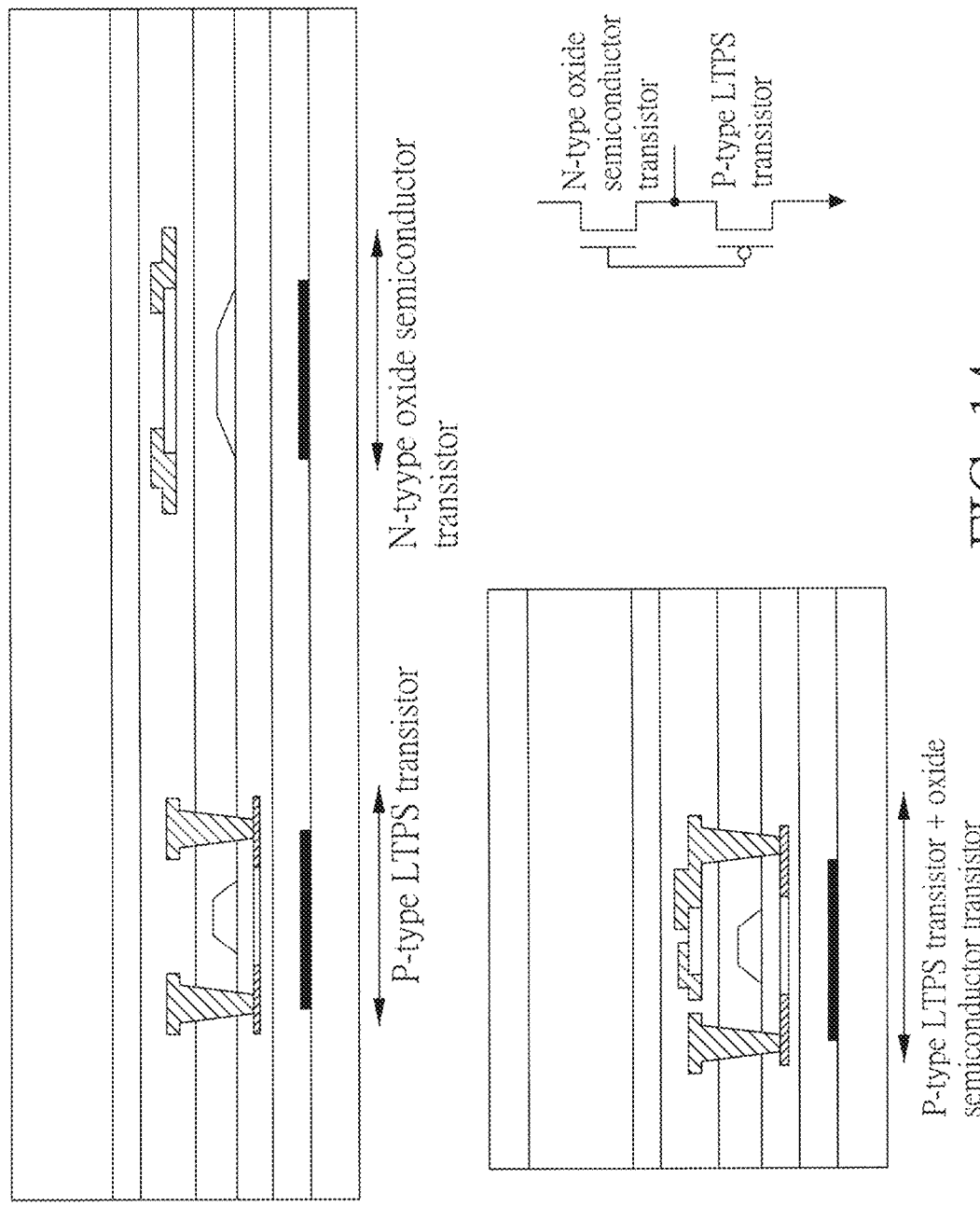
FIG. 14 is a cross-section view of partial transistors in FIG. 13 according to the present disclosure.

FIG. 14 is a cross-section view of partial transistors in FIG. 13 according to the present disclosure. As shown, in the upper-half of FIG. 14, it shows the cross-section view of an LTPS transistor and an oxide semiconductor transistor. In the left-bottom corner of FIG. 14, it shows the cross-section view of the fifth transistor (T5) and the sixth transistor (T6). The layouts of the fifth transistor (T5) and the sixth transistor (T6) are stacked up to form a three-dimensional layout so as to reduce the layout area. The layouts in FIG. 14 are well-known to the person skilled in the art based on the present disclosure, and thus a detailed description therefor is deemed unnecessary.

Figure 15:
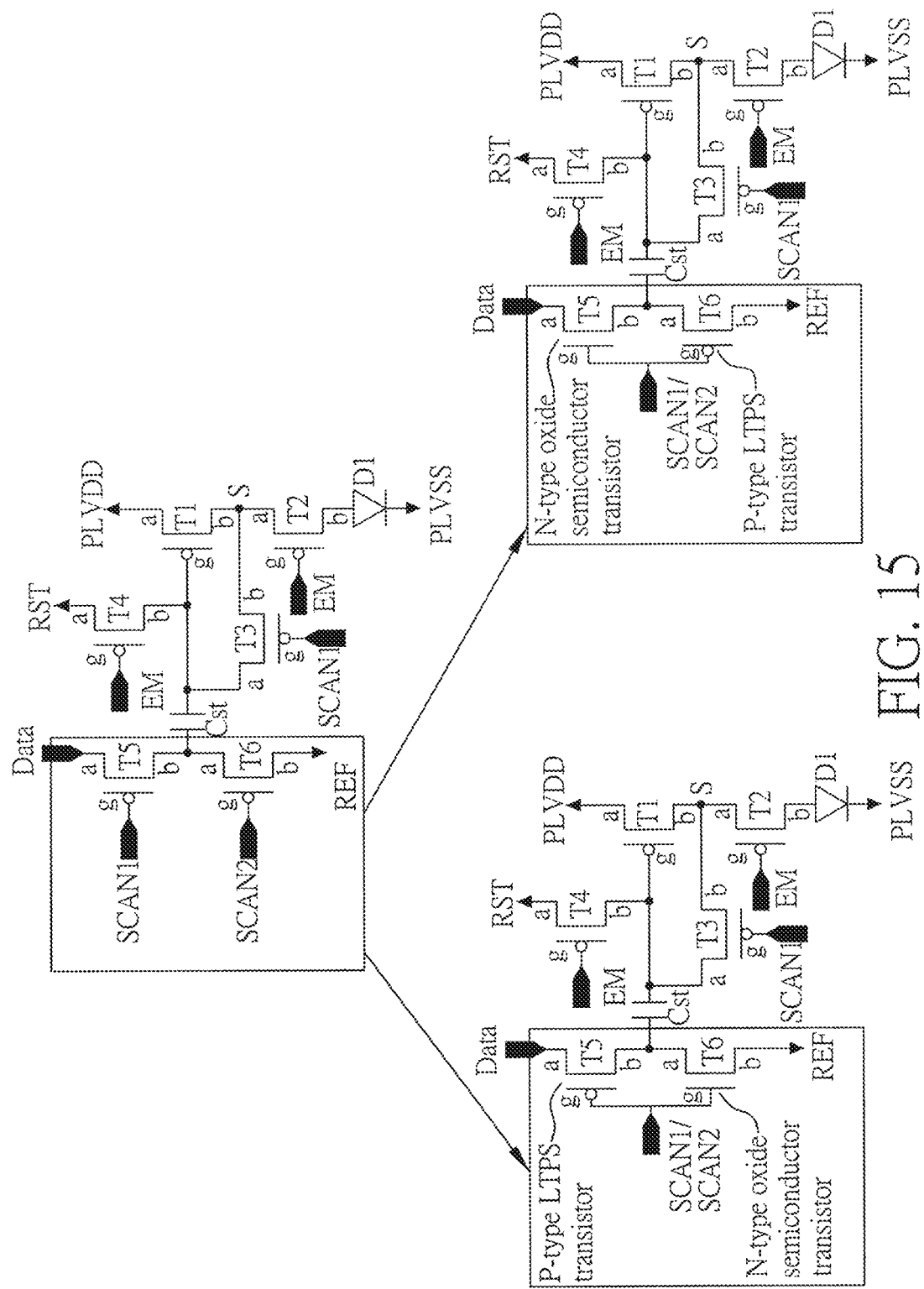
FIG. 15 is a circuit diagram of two driving circuits modified from the driving circuit of FIG. 7 according to the present disclosure.

FIG. 15 is a schematic diagram of two driving circuits modified from the driving circuit 200 of FIG. 7 according to the present disclosure. As shown in FIG. 15, the second control signal (SCAN1) is shorted with fourth control signal (SCAN2). In the left-bottom corner of FIG. 15, the fifth transistor (T5) is a P-type LTPS transistor and the sixth transistor (T6) is an N-type oxide semiconductor transistor. In the right-bottom corner of FIG. 14, the fifth transistor (T5) is an N-type oxide semiconductor transistor and the sixth transistor (T6) is a P-type LTPS transistor.

Figure 16:
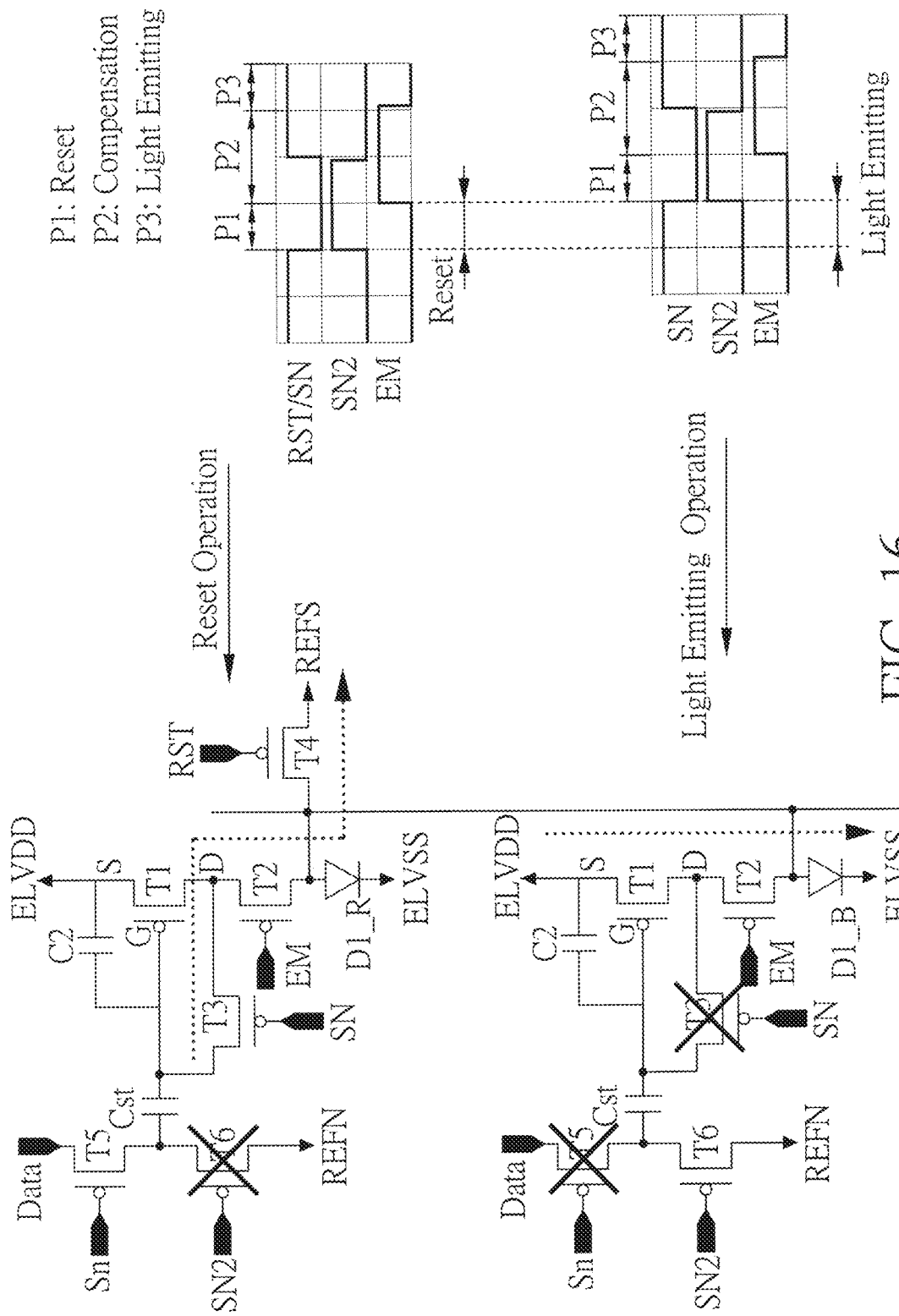
FIG. 16 to FIG. 20 are schematic views illustrating applications of the driving circuit of active-matrix organic light-emitting diode with hybrid transistors of FIG. 5 according to the present disclosure.

FIG. 16 to FIG. 20 are schematic views illustrating applications of the driving circuit 200 of active-matrix organic light-emitting diode with hybrid transistors of FIG. 5 according to the present disclosure. As shown in FIG. 16, the driving circuit 200 further includes a second capacitor (C2). One terminal of the second capacitor (C2) is connected to the first terminal (a) of the first transistor (T1) and the other terminal of the second capacitor (C2) is connected to the control terminal (g) of the first transistor (T1). The two driving circuits 200 share the fourth transistor (T4). As shown in FIG. 16, in a reset period (P1), the upper driving circuit 200 performs the reset operation and the lower driving circuit 200 performs the light emitting operation. That is, in the timing diagram, the upper driving circuit 200 is in the reset period (P1) and the lower driving circuit 200 is in a light emitting period (P3).

Figure 17:
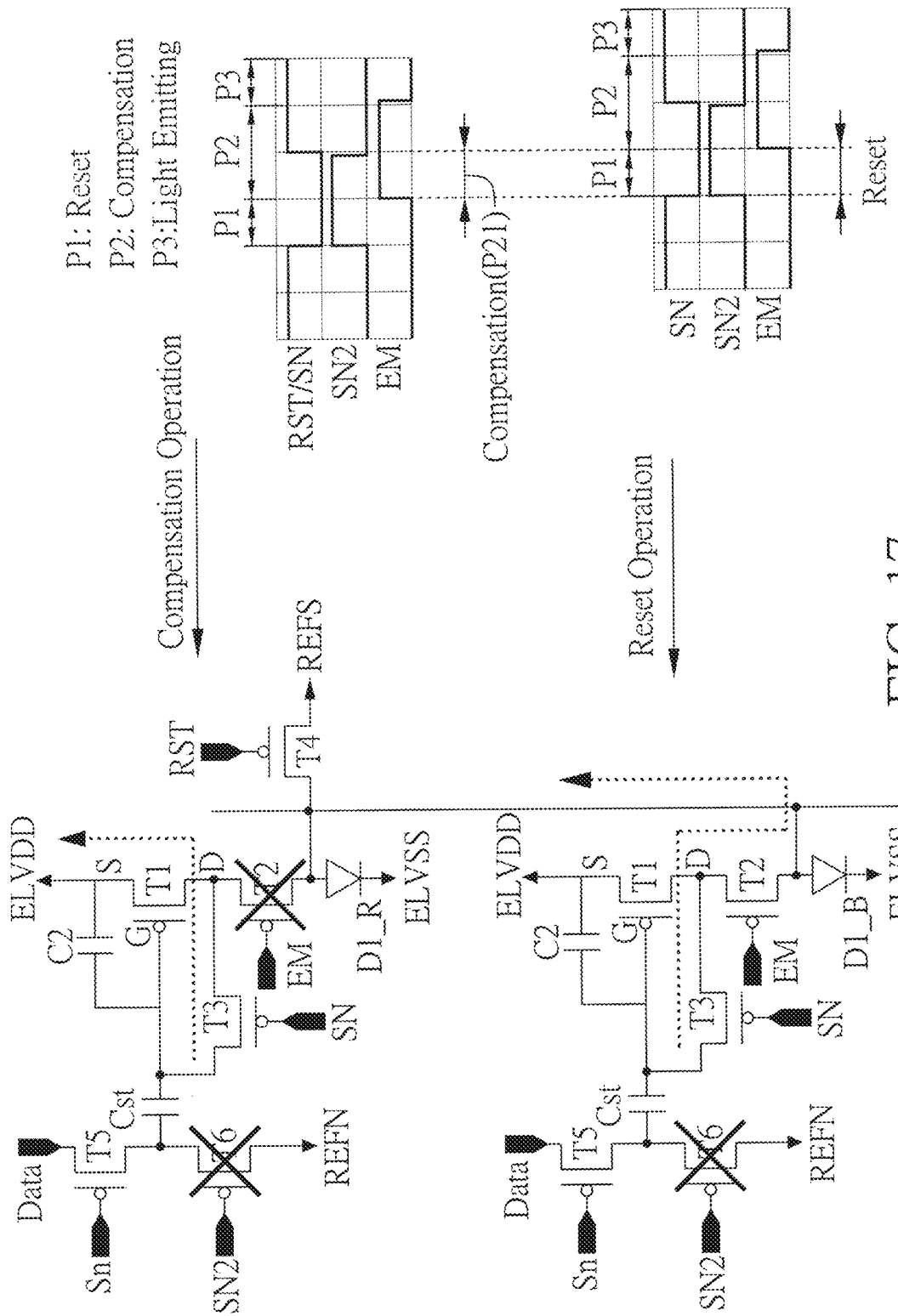
Figure 18:
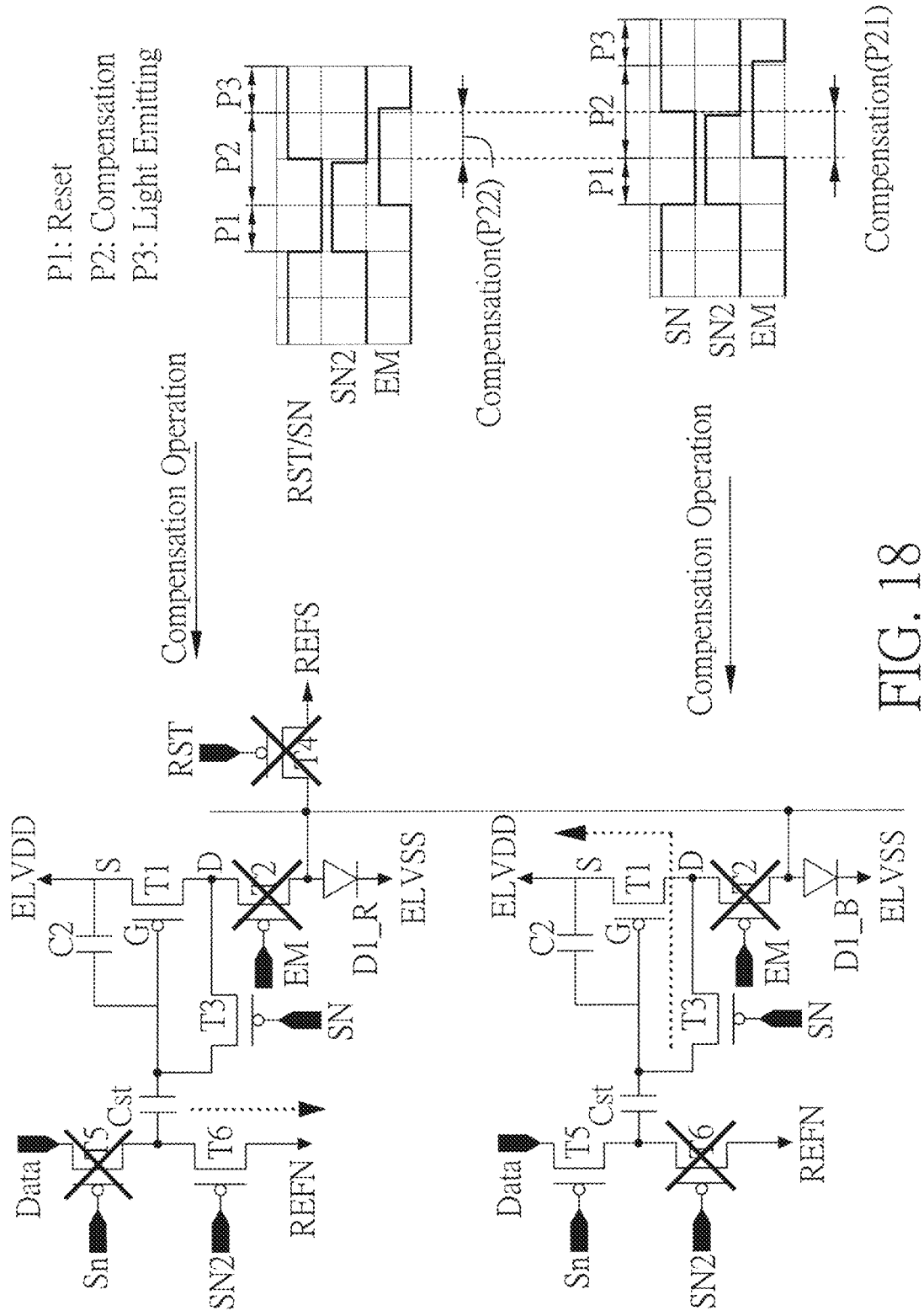

As shown in FIG. 17, in a first time period (P21) of a compensation period (P2), the upper driving circuit 200 performs the compensation operation and the lower driving circuit 200 performs the reset operation. That is, in the timing diagram, the lower driving circuit 200 is in the reset period (P1). As shown in FIG. 18, in a second time period (P22) of the compensation period (P2), the upper driving circuit 200 performs the compensation operation and the lower driving circuit 200 performs the compensation operation. That is, in the timing diagram, the lower driving circuit 200 is in the first time period (P21) of the compensation period (P2).

Figure 19:
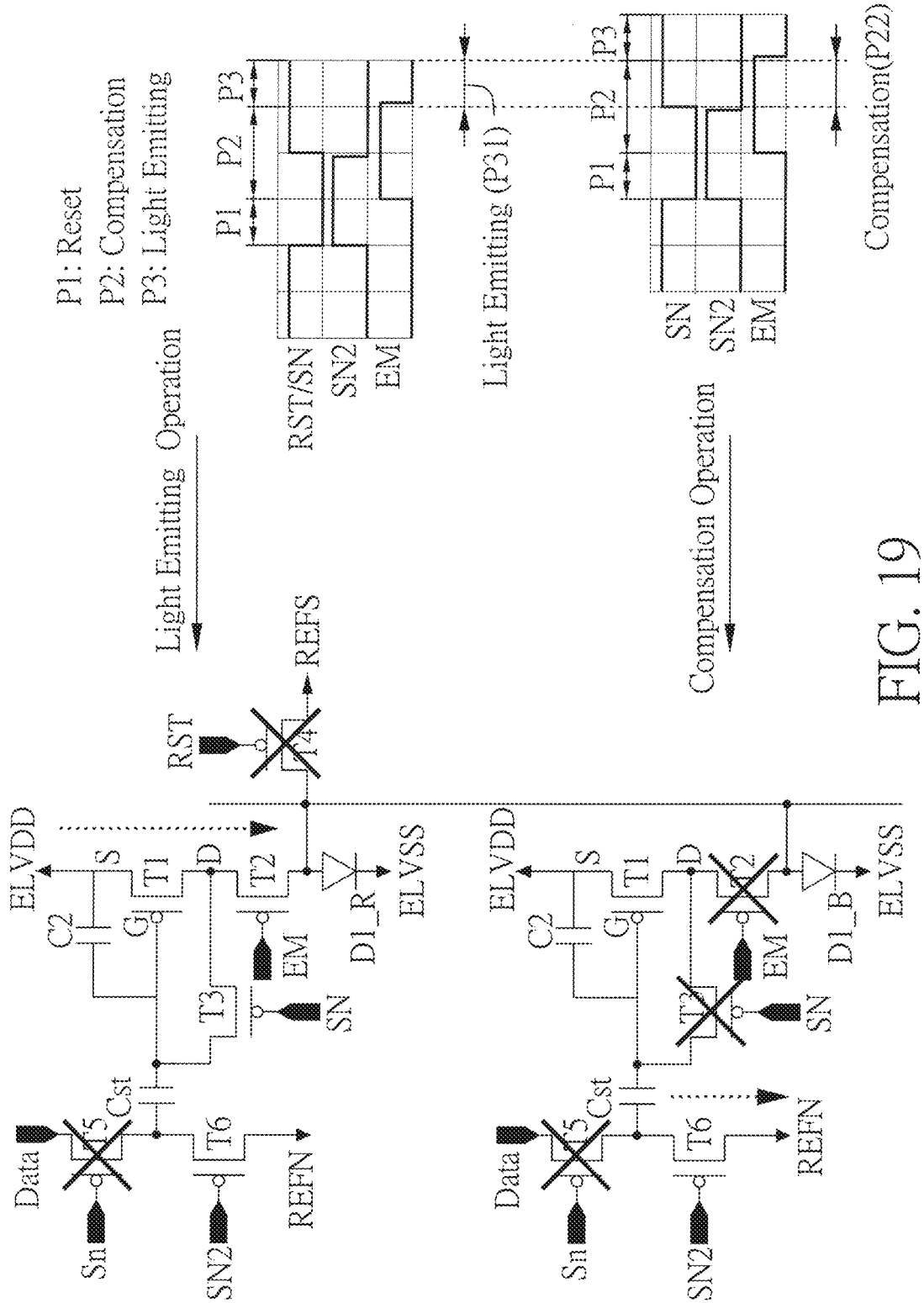
Figure 20:
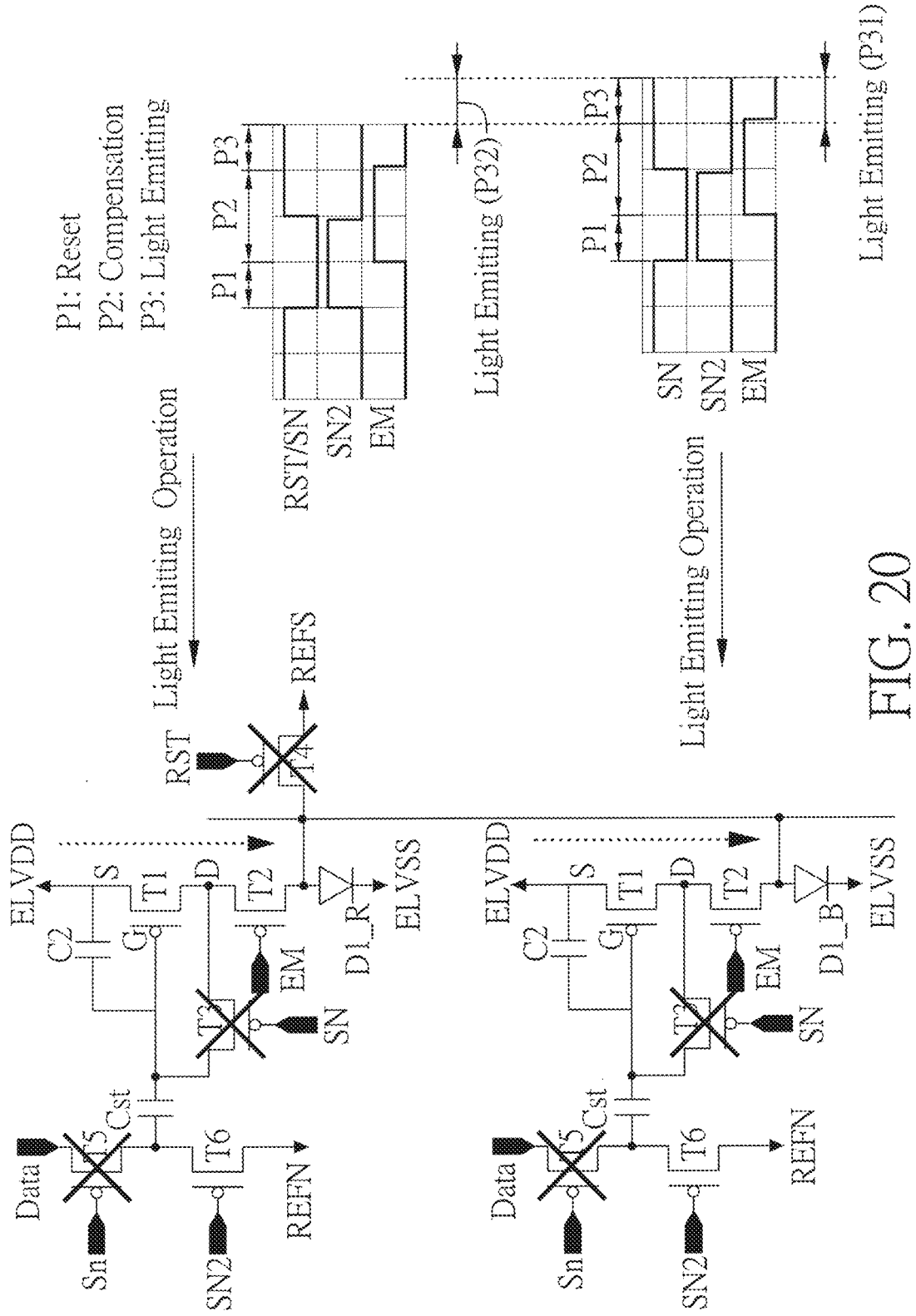

As shown in FIG. 19, in a first time period (P31) of a light emitting period (P3), the upper driving circuit 200 performs the light emitting operation and the lower driving circuit 200 performs the compensation operation. That is, in the timing diagram, the lower driving circuit 200 is in the second time period (P22) of the compensation period (P2). As shown in FIG. 20, in a second time period (P32) of the light emitting period (P3), the upper driving circuit 200 performs the light emitting operation and the lower driving circuit 200 performs the light emitting operation. That is, in the timing diagram, the lower driving circuit 200 is in the first time period (P31) of a light emitting period (P3).

Figure 21:
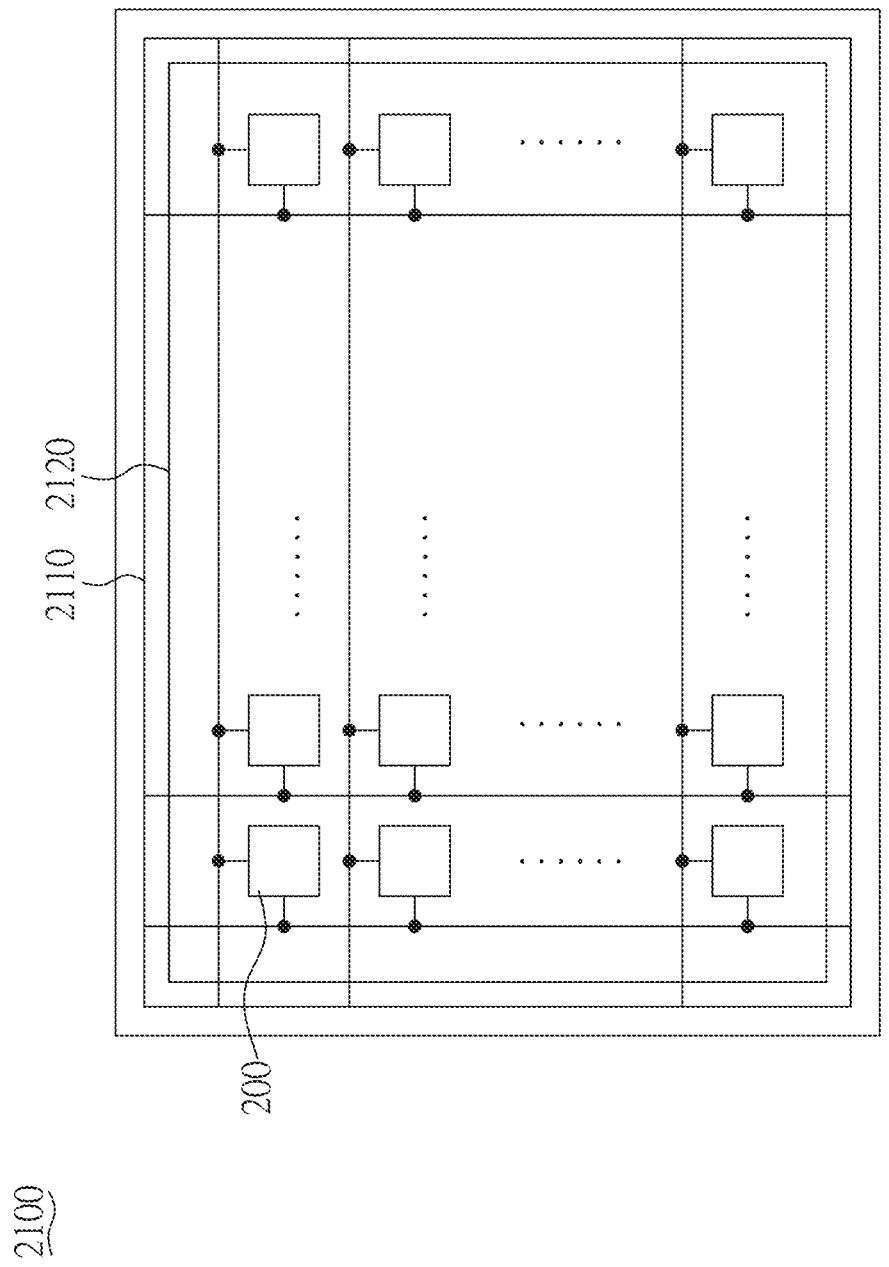
FIG. 21 is a schematic diagram of a display device according to the present disclosure.

FIG. 21 is a schematic diagram of a display device 2100 according to the present disclosure. The display device 2100 comprises a substrate 2110, a display media 2120, and driving circuit 200, wherein the driving circuit 200 comprises a current drive unit 210 and a reset compensation and light emitting control circuit 220.

The display media 2120 is disposed above the substrate 2110. The display media 2120 can be an OLED display media or a micro-LED display media. The current drive unit 210 is disposed above the substrate 2110. The current drive unit 210 includes a first transistor (T1) and a second transistor (T2), wherein the first transistor (T1) and the second transistor (T2) are connected in series, and wherein the first transistor (T1) and the second transistor (T2) comprises a silicon semiconductor layer, respectively. The silicon semiconductor layer is a low temperature poly-silicon (LTPS) layer. That is, the first transistor (T1) and the second transistor (T2) are LTPS transistors.

The reset compensation and light emitting control circuit 220 is coupled to the current drive unit 210. The reset compensation and light emitting control circuit 220 comprises a third transistor (T3) connected to a control terminal of the first transistor (T1), wherein the third transistor (T3) comprises an oxide semiconductor layer. The oxide semiconductor layer is an Indium Gallium Zinc Oxide (IGZO) layer. The third transistor (T3) is an oxide semiconductor transistor.

From the descriptions of FIG. 16 to FIG. 20, it is known that the driving circuit 200 can share the corresponding reset transistor with the other driving circuit 200. Therefore, in the application of the driving circuits of FIG. 3, FIG. 7, and FIG. 11, the number of transistors can be dramatically reduced. For example, in a full high definition (FHD) display panel, the display panel has 6220800 (=1080×1920×3) sub-pixels and thus there are 6220800 driving circuit 200. With the sharing technology of the present disclosure, there is one transistor saved for two driving circuits 200. Therefore, in a full high definition (FHD) display panel, it can save 3,110,400 transistors.

From the aforementioned descriptions, in the present disclosure, each of the transistors of the current drive unit 210 is an LTPS transistor to provide a large driving current with large driving capability to drive the OLDE (D1). The transistor of the reset compensation and light emitting control circuit 220 which is connected to the control terminal (g) of the first transistor (T1) is an oxide semiconductor transistor for providing a low leakage current to eliminate the voltage variation of the control terminal (g) of the first transistor (T1). Therefore, the first transistor (T1) can provide a stable current to drive the OLED (D1) so as to mitigate the mura or poor brightness uniformity problem.

Furthermore, the present disclosure also provides a transistor sharing technology for two driving circuits 200 so as to significantly reduce the number of transistors.

Although the present disclosure has been explained in relation to its preferred example, it is to be understood that many other possible modifications and variations can be made without departing from the spirit and scope of the disclosure as hereinafter claimed.

What is claimed is:

1. An electronic device, comprising:
a substrate;
a first silicon transistor disposed on the substrate and having a first terminal electrically connected to a first voltage level, a second terminal and a control terminal;
a second silicon transistor disposed on the substrate and having a first terminal electrically connected to the second terminal of the first silicon transistor, a second terminal electrically connected to a second voltage level, and a control terminal electrically connected to the control terminal of the first silicon transistor; and
a first oxide semiconductor transistor disposed on the substrate and having a first terminal electrically connected to the first terminal of the second silicon transistor,
wherein a voltage value of the first voltage level is greater than a voltage value of the second voltage level.

2. The electronic device as claimed in claim 1, wherein a first current flows from the second terminal of the first silicon transistor to the first terminal of the first oxide semiconductor transistor.

3. The electronic device as claimed in claim 1, further comprising a third silicon transistor having a first terminal electrically connected to the second terminal of the first silicon transistor.

4. The electronic device as claimed in claim 3, wherein the third silicon transistor has a second terminal electrically connected to the first terminal of the second silicon transistor.

5. The electronic device as claimed in claim 3, wherein the third silicon transistor has a control terminal electrically connected to a second terminal of the first oxide semiconductor transistor.

6. The electronic device as claimed in claim 3, further comprising a second oxide semiconductor transistor having a first terminal electrically connected to a control terminal of the third silicon transistor.

7. The electronic device as claimed in claim 1, further comprising a second oxide semiconductor transistor having a first terminal electrically connected to a second terminal of the first oxide semiconductor transistor.

8. The electronic device as claimed in claim 7, further comprising a third silicon transistor having a control terminal electrically connected to the second terminal of the first oxide semiconductor transistor and the first terminal of the second oxide semiconductor transistor.

9. The electronic device as claimed in claim 1, further comprising a fourth silicon transistor having a first terminal electrically connected to the second terminal of the first silicon transistor.

10. The electronic device as claimed in claim 9, wherein the fourth silicon transistor has a second terminal electrically connected to a data line.

* * * * *